United States Patent
Inoue et al.

(10) Patent No.: US 10,984,978 B2
(45) Date of Patent: Apr. 20, 2021

(54) MULTIPLE ELECTRON BEAM INSPECTION APPARATUS AND MULTIPLE ELECTRON BEAM INSPECTION METHOD

(71) Applicant: NuFlare Technology, Inc., Yokohama (JP)

(72) Inventors: Hiromu Inoue, Yokohama (JP); Ryoichi Hirano, Setagaya-ku (JP); Masataka Shiratsuchi, Kawasaki (JP); Riki Ogawa, Kawasaki (JP)

(73) Assignee: NuFlare Technology, Inc., Yokohama (JP)

( * ) Notice: Subject to any disclaimer, the term of this patent is extended or adjusted under 35 U.S.C. 154(b) by 35 days.

(21) Appl. No.: 16/601,901

(22) Filed: Oct. 15, 2019

(65) Prior Publication Data
US 2020/0161082 A1    May 21, 2020

(30) Foreign Application Priority Data
Nov. 15, 2018 (JP) .............................. JP2018-214428

(51) Int. Cl.
  *H01J 37/22* (2006.01)
  *H01J 37/244* (2006.01)
  *H01J 37/28* (2006.01)

(52) U.S. Cl.
  CPC .......... *H01J 37/222* (2013.01); *H01J 37/244* (2013.01); *H01J 37/28* (2013.01);
  (Continued)

(58) Field of Classification Search
  CPC .... H01J 37/28; H01J 2237/2817; H01J 37/20; H01J 37/222; H01J 37/244;
  (Continued)

(56) References Cited

U.S. PATENT DOCUMENTS 9,188,554 B2 * 11/2015 Shishido ............ G01N 23/2251
10,734,190 B2 * 8/2020 Ando ...................... H01J 37/153
(Continued)

FOREIGN PATENT DOCUMENTS

JP         2013-246062 A       12/2013

OTHER PUBLICATIONS

Lifshin, E, et al. "A Software Approach to Improving SEM Resolution, Image Quality, and Productivity," Microscopy Today, May 2017, p. 18-24.

*Primary Examiner* — David A Vanore
(74) *Attorney, Agent, or Firm* — Oblon, McClelland, Maier & Neustadt, L.L.P.

(57) ABSTRACT

According to one aspect of the present invention, a multiple electron beam inspection apparatus includes a reference image generation circuit generating reference images corresponding to the secondary electron images, in accordance with an image generation characteristic of a secondary electron image by irradiation of one beam; and a correction circuit generating corrected reference images in which, on the basis of deviation information between a figure pattern of the secondary electron image by irradiation of the one beam of the multiple primary electron beams and a figure pattern of a secondary electron image by irradiation of another beam different from the one beam of the multiple primary electron beams, a shape of a figure pattern of a reference image corresponding to the figure pattern of the secondary electron image by the irradiation of the another beam in the reference images is corrected.

15 Claims, 13 Drawing Sheets

(52) U.S. Cl.
CPC ... *H01J 2237/153* (2013.01); *H01J 2237/221* (2013.01); *H01J 2237/2448* (2013.01); *H01J 2237/2817* (2013.01)

(58) Field of Classification Search
CPC ......... H01J 2237/2448; H01J 2237/082; H01J 2237/153; H01J 2237/1532; H01J 2237/202; H01J 2237/20228; H01J 2237/24578; H01J 2237/2806; H01J 2237/2826; H01J 37/141; H01J 37/22; H01J 2237/0047; H01J 2237/0435; H01J 2237/1405; H01J 2237/1501; G03F 7/7065
USPC ....................................... 250/310, 311, 492.1
See application file for complete search history.

(56) References Cited

U.S. PATENT DOCUMENTS

| | | | |
|---|---|---|---|
| 10,790,110 B2 * | 9/2020 | Ogasawara | H01J 37/026 |
| 2002/0148961 A1 * | 10/2002 | Nakasuji | H01J 37/222 |
| | | | 250/311 |
| 2005/0045821 A1 * | 3/2005 | Noji | H01J 37/05 |
| | | | 250/311 |
| 2007/0057200 A1 * | 3/2007 | Fujita | B82Y 10/00 |
| | | | 250/492.1 |
| 2017/0122890 A1 * | 5/2017 | Inoue | H01J 37/28 |
| 2019/0096631 A1 * | 3/2019 | Takekoshi | H01J 37/268 |
| 2020/0104980 A1 * | 4/2020 | Inoue | H01J 37/20 |
| 2020/0286709 A1 * | 9/2020 | Shiratsuchi | H01J 37/244 |

\* cited by examiner

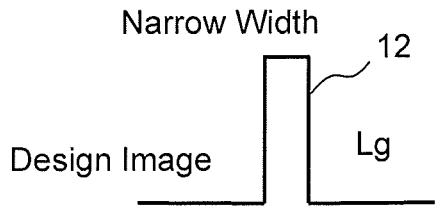
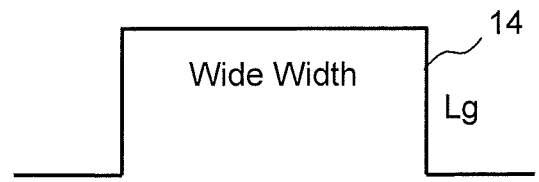
FIG.7A
FIG.7C
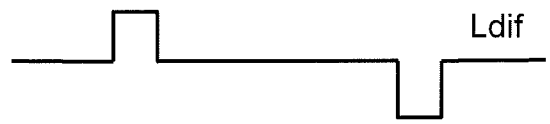
FIG.7E
FIG.7H
FIG.7F
FIG.7I
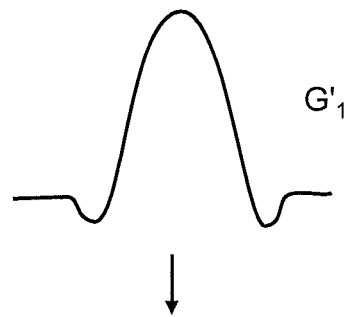
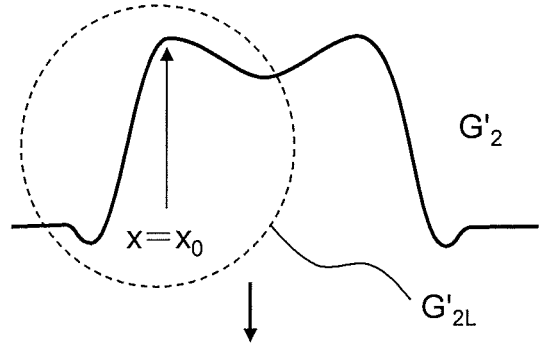
$G'_1 = C1 \times Ledge * G_1(x)$
$G'_{2L} = MAX(C1 \times L_{edge} * G_1(x),$
$C2 \times L_{edge} * G_2(x)$ if $Lg>0)$
FIG.7B
FIG.7D
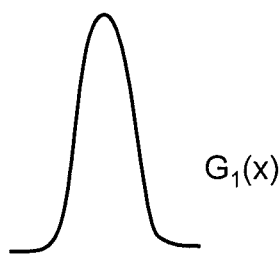
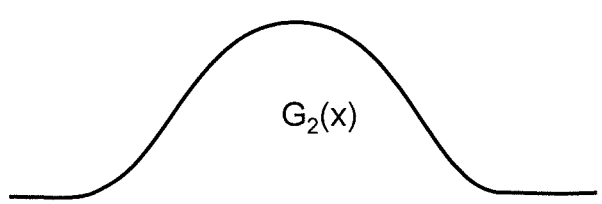
FIG.7G
FIG.7J $\Delta P_{x \cdot y}$
$\Delta W_{x \cdot y}$ $\Delta P_{0 \cdot 0}$
$\Delta W_{0 \cdot 0}$

FIG.9

Design Image

Reference Image

Corrected Reference Image
(Peripheral Beam)

MULTIPLE ELECTRON BEAM INSPECTION APPARATUS AND MULTIPLE ELECTRON BEAM INSPECTION METHOD

CROSS-REFERENCE TO RELATED APPLICATION

This application is based upon and claims the benefit of priority from prior Japanese Patent Application No. 2018-214428 filed on Nov. 15, 2018 in Japan, the entire contents of which are incorporated herein by reference.

BACKGROUND OF THE INVENTION

Field of the Invention

Embodiments described herein relate generally to a multiple electron beam inspection apparatus and a multiple electron beam inspection method. For example, embodiments described herein relate generally to an inspection apparatus that performs inspection using a secondary electron image of a pattern emitted by irradiation of multiple beams based on electron beams.

Related Art

Recently, with an increase in the degree of integration and an increase in the capacity of a large-scale integrated circuit (LSI), a circuit line width required for a semiconductor element decreases. Further, improvement of a yield is indispensable for manufacturing the LSI requiring a large manufacturing cost. However, as represented by a 1-Gbit random access memory (DRAM), patterns configuring the LSI are on the order of submicron to nanometer. In recent years, with the miniaturization of a dimension of an LSI pattern formed on a semiconductor wafer, a dimension to be detected as a pattern defect is also extremely small. Therefore, it is necessary to improve accuracy of a pattern inspection apparatus for inspecting a defect of an ultrafine pattern transferred to the semiconductor wafer. As one of major factors decreasing the yield, there is a pattern defect of a mask used at the time of exposing and transferring an ultrafine pattern on the semiconductor wafer by photolithography technology. For this reason, it is necessary to improve the accuracy of the pattern inspection apparatus for inspecting a defect of a transfer mask used for manufacturing the LSI.

As an inspection method, a method of performing inspection by comparing a measurement image obtained by imaging a pattern formed on a substrate, such as a semiconductor wafer or a lithography mask, with design data or a measurement image obtained by imaging the same pattern on the substrate is known. For example, as a pattern inspection method, there are a "die to die inspection" for comparing measurement image data obtained by imaging the same patterns at different places on the same substrate with each other and a "die to database inspection" for generating design image data (reference image) on the basis of pattern-designed design data and comparing the design image data with a measurement image to be measurement data obtained by imaging a pattern. The imaged image is sent as the measurement data to a comparison circuit. In the comparison circuit, after positions of the images are adjusted, the measurement data and the reference data are compared according to an appropriate algorithm. When the measurement data and the reference data are not matched, it is determined that there is a pattern defect.

In the pattern inspection apparatus, in addition to development of an apparatus that irradiates an inspection target substrate with a laser beam and images a transmitted image or a reflected image, development of an inspection apparatus that scans the inspection target substrate with an electron beam, detects secondary electrons emitted from the inspection target substrate according to irradiation of the electron beam, and acquires a pattern image is also advanced. In the inspection apparatus using the electron beam, development of an apparatus using multiple beams is also advanced. In an inspection apparatus which inspects an electron beam image in comparison with a reference image, in order to keep the inspection sensitivity at a constant level, it is necessary to generate a reference image so as to match the imaging characteristics of the electron beam image. However, in the case of using multiple beams, it is difficult to maintain inspection sensitivity at a constant level between beams because of differences in the characteristics of electron beam images between beams. For this reason, it is necessary to generate a reference image adapted to the characteristics of each beam.

Here, the lightness of the pattern portion, the lightness of the background portion, the lightness of the edge portion according to direction, and the blur amount of the edge portion are separately calculated for each beam of multiple beams as parameters and compared with the actual SEM image. The point of generating a simulated SEM image is disclosed (see Published Unexamined Japanese Patent Application No. 2013-246062 (JP-A-2013-246062), for example). However, in such a method, it is necessary to obtain individual parameters for each beam by individually calculating for each beam the model signal waveform using design data and the real signal waveform of a real SEM image. After all, this is similar to the fact that filter functions for generating reference images from design data are individually calculated and determined for each beam prior to inspection. Therefore, the amount of calculation is still large. Therefore, it is desirable to have a method that can more easily adapt to the characteristic difference between beams.

BRIEF SUMMARY OF THE INVENTION

According to one aspect of the present invention, a multiple electron beam inspection apparatus includes:

a secondary electron image acquisition mechanism acquiring secondary electron images of figure patterns by irradiating a substrate formed with the figure patterns with multiple primary electron beams and detecting multiple secondary electron beams emitted from the substrate in accordance with the irradiation of the multiple primary electron beams;

a reference image generation circuit generating reference images corresponding to the secondary electron images, in accordance with an image generation characteristic of a secondary electron image by irradiating one beam of the multiple primary electron beams, based on design data of the figure patterns;

a correction circuit generating corrected reference images in which, on the basis of deviation information between a figure pattern of the secondary electron image by irradiating the one beam of the multiple primary electron beams and a figure pattern of a secondary electron image by irradiating another beam different from the one beam of the multiple primary electron beams, a shape of a figure pattern of a reference image corresponding to the figure pattern of the secondary electron image by the irradiation of the another beam in the reference images is corrected; and a comparison circuit comparing a secondary electron image of the secondary electron images and a corrected reference image of the corrected reference images.

According to another aspect of the present invention, a multiple electron beam inspection method includes:

acquiring secondary electron images of figure patterns by irradiating a substrate formed with the figure patterns with multiple primary electron beams and detecting multiple secondary electron beams emitted from the substrate in accordance with the irradiation of the multiple primary electron beams;

generating reference images corresponding to the secondary electron images, in accordance with an image generation characteristic of a secondary electron image by irradiating one beam of the multiple primary electron beams, based on design data of the figure patterns;

generating corrected reference images in which, on the basis of deviation information between a figure pattern of the secondary electron image by irradiating the one beam of the multiple primary electron beams and a figure pattern of a secondary electron image by irradiating another beam different from the one beam of the multiple primary electron beams, a shape of a figure pattern of a reference image corresponding to the figure pattern of the secondary electron image by the irradiation of the another beam in the reference images is corrected; and comparing a secondary electron image of the secondary electron images and a corrected reference image of the corrected reference images and outputting a comparison result.

BRIEF DESCRIPTION OF THE DRAWINGS

FIGS. 7A to 7J are diagrams showing an example of an edge waveform of a design image, an edge waveform of a measurement image, and a model of a filter function in the first embodiment;

FIG. 9 is a diagram illustrating an example of an edge slope inclination deviation data map in the first embodiment;

DETAILED DESCRIPTION OF THE INVENTION

Hereinafter, in an embodiment, an apparatus and a method capable of easily generating a reference image adapted to a characteristic difference between beams in multiple beam inspection as compared with the conventional method will be described.

First Embodiment

Figure 1:
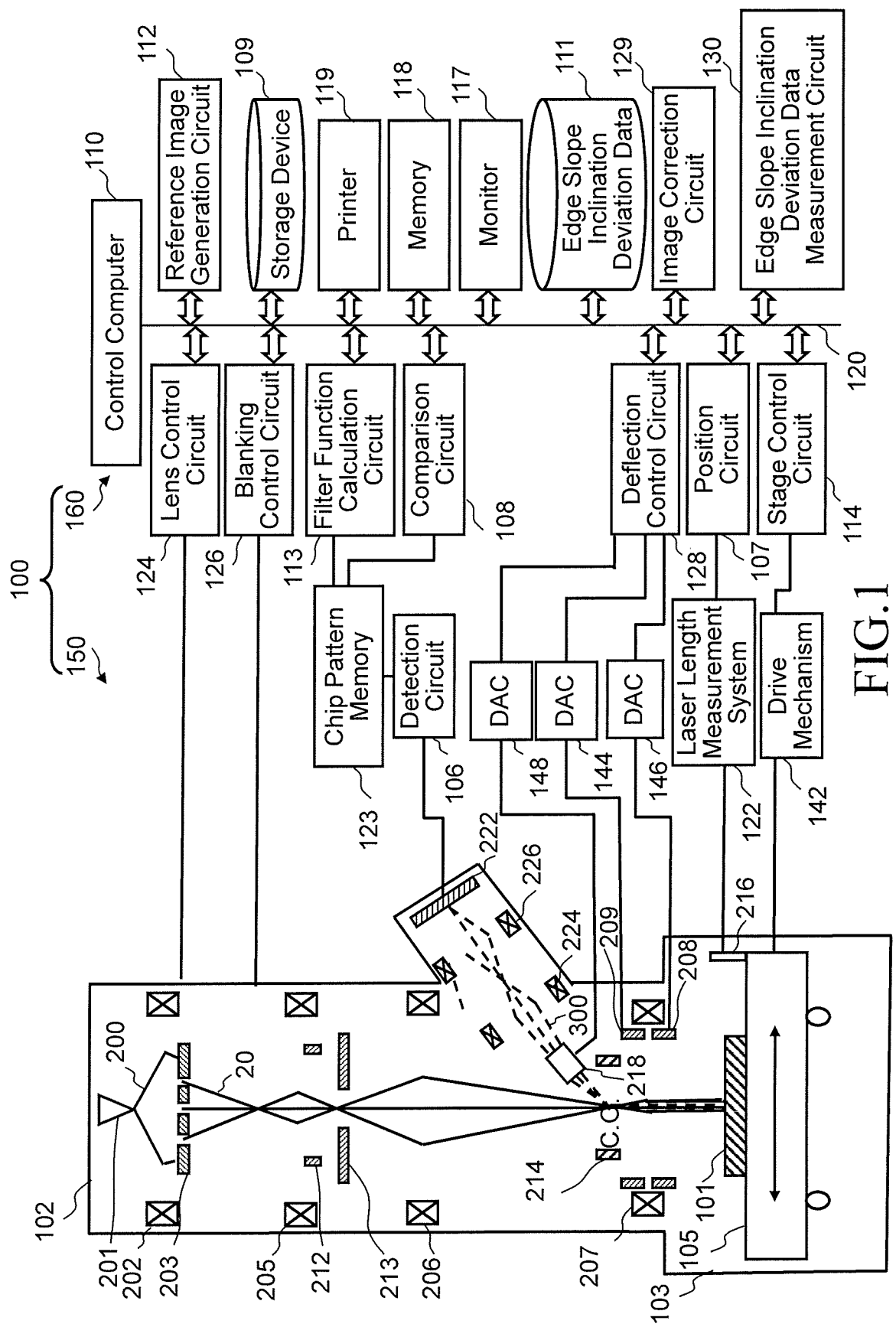
FIG. 1 is a configuration diagram showing a configuration of a pattern inspection apparatus in a first embodiment.

FIG. 1 is a configuration diagram showing a configuration of a pattern inspection apparatus in a first embodiment. In FIG. 1, an inspection apparatus 100 to inspect a pattern formed on a substrate is an example of a multiple electron beam inspection apparatus. The inspection apparatus 100 includes an image acquisition mechanism 150 and a control system circuit 160. The image acquisition mechanism 150 includes an electron beam column 102 (electron lens barrel) and an inspection chamber 103. In the electron beam column 102, an electron gun assembly 201, an electromagnetic lens 202, a shaping aperture array substrate 203, an electromagnetic lens 205, a collective blanking deflector 212, a limitation aperture substrate 213, an electromagnetic lens 206, an electromagnetic lens 207 (objective lens), a main deflector 208, a sub-deflector 209, a beam separator 214, a deflector 218, an electromagnetic lens 224, an electromagnetic lens 226, a multi-detector 222 are disposed.

In the inspection chamber 103, a stage 105 to be movable in at least X, Y, and Z directions is disposed. On the stage 105, a substrate 101 (target object) to be inspected is disposed. The substrate 101 includes a mask substrate for exposure and a semiconductor substrate such as a silicon wafer. When the substrate 101 is the semiconductor substrate, a plurality of chip patterns (wafer dies) are formed on the semiconductor substrate. When the substrate 101 is the mask substrate for exposure, a chip pattern is formed on the mask substrate for exposure. The chip pattern is configured by a plurality of figure patterns. A plurality of chip patterns (wafer dies) are formed on the semiconductor substrate by exposing and transferring the chip pattern formed on the mask substrate for exposure to the semiconductor substrate a plurality of times. Hereinafter, the case where the substrate 101 is the semiconductor substrate will be mainly described. The substrate 101 is disposed on the stage 105 with a pattern formation surface oriented upward, for example. Further, a mirror 216 for reflecting a laser beam for laser length measurement emitted from a laser length measurement system 122 disposed outside the inspection chamber 103 is disposed on the stage 105. The multi-detector 222 is connected to a detection circuit 106 outside the electron beam column 102. The detection circuit 106 is connected to a chip pattern memory 123.

In the control system circuit 160, a control computer 110 for controlling the entire inspection apparatus 100 is connected to a position circuit 107, a comparison circuit 108, a reference image generation circuit 112, a filter function calculation circuit 113, a stage control circuit 114, a lens control circuit 124, a blanking control circuit 126, a deflection control circuit 128, an image correction circuit 129, an edge slope inclination deviation data measurement circuit 130, storage devices 109 and 111 such as magnetic disk drives, a monitor 117, a memory 118, and a printer 119 via a bus 120. Further, the deflection control circuit 128 is connected to a digital-analog conversion (DAC) amplifiers 144, 146, and 148. The DAC amplifier 146 is connected to the main deflector 208 and the DAC amplifier 144 is connected to the sub-deflector 209. The DAC amplifier 148 is connected to the deflector 218.

Further, the chip pattern memory 123 is connected to the comparison circuit 108 and the filter function calculation circuit 113. Further, the stage 105 is driven by a drive mechanism 142 under the control of the stage control circuit 114. In the drive mechanism 142, for example, a drive system such as three-axis (X-Y-θ) motors driven in an X direction, a Y direction, and a θ direction in a stage coordinate system is configured and the stage 105 is movable in the X, Y, and θ directions. For these X-axis motor, Y-axis motor, and θ-axis motor not shown in the drawings, for example, step motors can be used. The stage 105 is movable in a horizontal direction and a rotational direction by the motors of the X, Y, and θ axes. Further, in the drive mechanism 142, the stage 105 is controlled to be movable in the Z direction (height direction) using, for example, a piezo element or the like. In addition, a movement position of the stage 105 is measured by the laser length measurement system 122 and is supplied to the position circuit 107. The laser length measurement system 122 receives reflected light from the mirror 216 and measures a position of the stage 105 by the principle of a laser interference method. In the stage coordinate system, for example, the X direction, the Y direction, and the θ direction are set with respect to a plane orthogonal to an optical axis (electron orbit center axis) of multiple primary electron beams.

The electromagnetic lens 202, the electromagnetic lens 205, the electromagnetic lens 206, the electromagnetic lens 207 (objective lens), the electromagnetic lens 224, the electromagnetic lens 226, and the beam separator 214 are controlled by the lens control circuit 124. Further, the collective blanking deflector 212 is configured by two or more electrodes, and is controlled by the blanking control circuit 126 via a DAC amplifier not shown in the drawings for each electrode. The sub-deflector 209 is configured by four or more electrodes, and is controlled by the deflection control circuit 128 via the DAC amplifier 144 for each electrode. The main deflector 208 is configured by four or more electrodes, and is controlled by the deflection control circuit 128 via the DAC amplifier 146 for each electrode. The deflector 218 is configured by four or more electrodes, and is controlled by the deflection control circuit 128 via the DAC amplifier 148 for each electrode.

A high-voltage power supply circuit not shown in the drawings is connected to the electron gun assembly 201, and an electron group emitted from a cathode is accelerated by application of an acceleration voltage from the high-voltage power supply circuit between a filament (cathode) and an extraction electrode (anode) not shown in the drawings in the electron gun assembly 201, application of a voltage of another extraction electrode (Wehnelt), and heating of the cathode at a predetermined temperature, becomes an electron beam 200, and is emitted.

Here, in FIG. 1, the configuration necessary for describing the first embodiment is described. The inspection apparatus 100 may generally include other necessary configuration.

Figure 2:
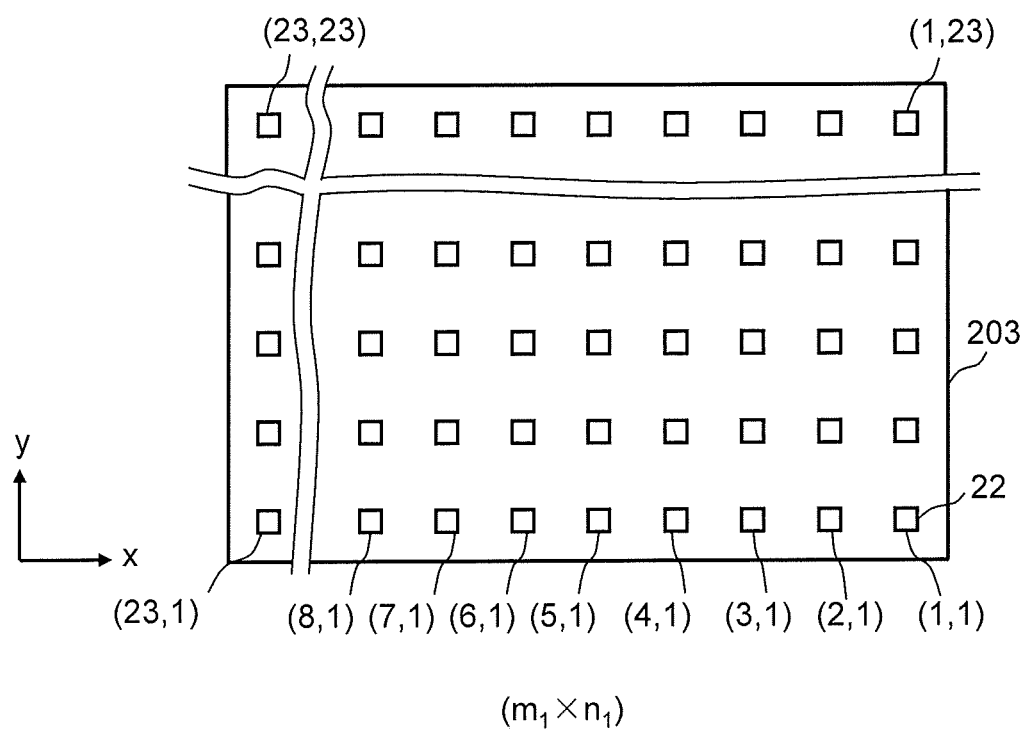
FIG. 2 is a conceptual diagram showing a configuration of a shaping aperture array substrate in the first embodiment.

FIG. 2 is a conceptual diagram showing a configuration of the shaping aperture array substrate in the first embodiment. In FIG. 2, in the shaping aperture array substrate 203, $m_1 \times n_1$ ($m_1$ and $n_1$ are integers of 2 or more) holes (openings) 22 to be arranged two-dimensionally in a width direction (x direction) and a length direction (y direction) are formed in the x and y directions at a predetermined arrangement pitch. In an example of FIG. 2, the case where 23×23 holes (openings) 22 are formed is shown. Each hole 22 is formed of a rectangle having the same dimension and shape. Alternatively, each hole 22 may have a shape of a circle with the same outer diameter. A part of the electron beam 200 passes through the plurality of holes 22, so that multiple beams 20 are formed. Here, an example in which two rows or more of holes 22 are disposed in both the width and length directions (x and y directions) is shown. However, the present disclosure is not limited thereto. For example, a plurality of rows of holes 22 may be disposed in one of the width and length directions (x and y directions) and only one row of holes 22 may be disposed in the other direction. Further, a method of disposing the holes 22 is not limited to the case where the holes 22 are disposed in a lattice in the width and length directions, as shown in FIG. 2. For example, the holes in a k-th row in the length direction (y direction) and the holes in a (k+1)-th row may be disposed to be deviated by a dimension a in the width direction (x direction). Similarly, the holes in the (k+1)-th row in the length direction (y direction) and the holes in a (k+2)-th row may be disposed to be deviated by a dimension b in the width direction (x direction).

Next, an operation of the image acquisition mechanism 150 in the inspection apparatus 100 will be described.

The electron beam 200 emitted from the electron gun assembly 201 (emission source) is refracted by the electromagnetic lens 202 and illuminates the entire shaping aperture array substrate 203. As shown in FIG. 2, the plurality of holes 22 (openings) are formed in the shaping aperture array substrate 203, and the electron beam 200 illuminates a region including all of the plurality of holes 22. Each part of the electron beam 200 with which the positions of the plurality of holes 22 are irradiated passes through the plurality of holes 22 of the shaping aperture array substrate 203, so that multiple primary electron beams 20 are formed.

The formed multiple primary electron beams 20 are refracted by the electromagnetic lens 205 and the electromagnetic lens 206, pass through the beam separator 214 disposed at a crossover position of each beam of the multiple primary electron beams 20 while repeating an intermediate image and a crossover, and travel to the electromagnetic lens 207 (objective lens). In addition, the electromagnetic lens 207 focuses the multiple primary electron beams 20 on the substrate 101. The multiple primary electron beams 20 focused on the surface of the substrate 101 (target object) by the objective lens 207 are collectively deflected by the main deflector 208 and the sub-deflector 209, and the respective irradiation positions of the respective beams on the substrate 101 are irradiated with the multiple primary electron beams 20. When the entire multiple primary electron beams 20 are collectively deflected by the collective blanking deflector 212, the positions of multiple primary electron beams 20 deviate from the center hole of the limitation aperture substrate 213 and the multiple primary electron beams 20 are shielded by the limitation aperture substrate 213. On the other hand, the multiple primary electron beams 20 not deflected by the collective blanking deflector 212 pass through the center hole of the limitation aperture substrate 213 as shown in FIG. 1. Blanking control is performed by turning on/off the collective blanking deflector 212 and turning on/off of the beams is collectively controlled. As described above, the limitation aperture substrate 213 shields the multiple primary electron beams 20 deflected so that the beams are turned off by the collective blanking deflector 212. Further, the multiple primary electron beams 20 for inspection (image acquisition) are formed by a group of beams formed until the beams are turned off after the beams are turned on and having passed through the limitation aperture substrate 213.

If a desired position of the substrate 101 is irradiated with the multiple primary electron beams 20, a secondary electron flux (multiple secondary electron beams 300) including reflected electrons, corresponding to the respective beams of the multiple primary electron beams 20 (multiple primary electron beams), is emitted from the substrate 101 due to the irradiation of the multiple primary electron beams 20.

The multiple secondary electron beams 300 emitted from the substrate 101 travel to the beam separator 214 through the electromagnetic lens 207.

Here, the beam separator 214 generates an electric field and a magnetic field in directions orthogonal to each other on a plane orthogonal to a traveling direction (electron orbit center axis) of a center beam of the multiple primary electron beams 20. The electric field exerts a force in the same direction regardless of a traveling direction of electrons. Meanwhile, the magnetic field exerts a force according to the Fleming's left-hand rule. Therefore, it is possible to change the direction of the force acting on the electrons depending on a penetration direction of the electrons. The force due to the electric field and the force due to the magnetic field cancel each other in the multiple primary electron beams 20 penetrating the beam separator 214 from the upper side, and the multiple primary electron beams 20 go straight downward. Meanwhile, in the multiple secondary electron beams 300 penetrating the beam separator 214 from the lower side, both the force due to the electric field and the force due to the magnetic field act in the same direction, and the multiple secondary electron beams 300 are bent obliquely upward and separated from the multiple primary electron beams 20.

The multiple secondary electron beams 300 that are bent obliquely upward and separated from the multiple primary electron beams 20 are further bent by the deflector 218 and projected onto the multi-detector 222 while being refracted by the electromagnetic lenses 224 and 226. The multi-detector 222 detects the projected multiple secondary electron beams 300. Reflected electrons and secondary electrons may be projected onto the multi-detector 222, and the reflected electrons may be diverged on the way and the remaining secondary electrons may be projected. The multi-detector 222 has, for example, a two-dimensional sensor not shown in the drawings. In addition, each secondary electron of the multiple secondary electron beams 300 collides with each corresponding region of the two-dimensional sensor to generate electrons, and secondary electron image data is generated for each pixel. An intensity signal detected by the multi-detector 222 is output to the detection circuit 106.

Figure 3:
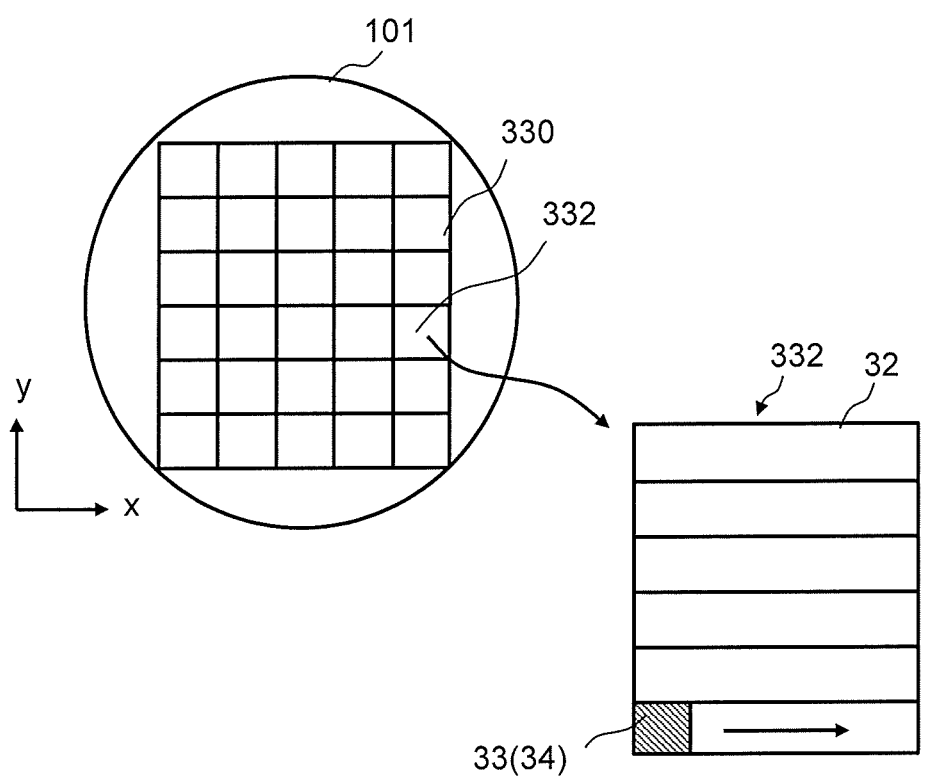
FIG. 3 is a diagram showing an example of a plurality of chip regions formed on a semiconductor substrate in the first embodiment.

FIG. 3 is a diagram showing an example of a plurality of chip regions formed on the semiconductor substrate in the first embodiment. In FIG. 3, when the substrate 101 is the semiconductor substrate (wafer), a plurality of chips (wafer dies) 332 are formed in a two-dimensional array in an inspection region 330 of the semiconductor substrate (wafer). In each chip 332, a mask pattern for one chip formed on the mask substrate for exposure is reduced to ¼ by an exposure device (stepper) not shown in the drawings and is transferred. The region of each chip 332 is divided into a plurality of stripe regions 32 with a predetermined width, for example, in the y direction. A scan operation by the image acquisition mechanism 150 is performed, for example, for each stripe region 32. Each stripe region 32 is divided into a plurality of mask dies 33 in a longitudinal direction. In the first embodiment, the mask die 33 becomes a unit inspection region. The movement of the beam to the target mask die 33 is performed by collective deflection of the entire multiple beams 20 by the main deflector 208.

Figure 4:
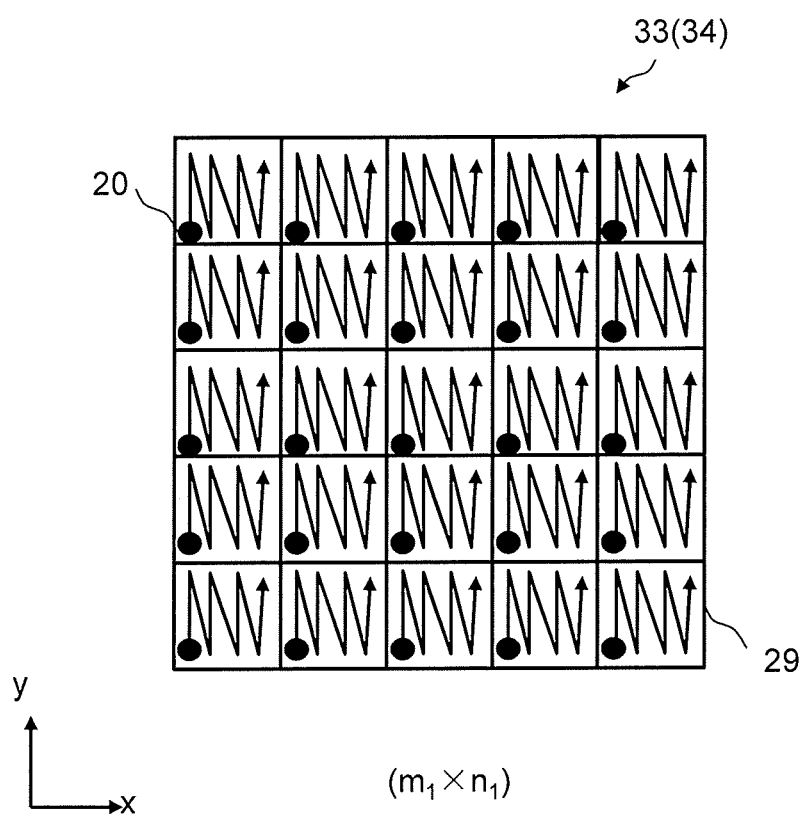
FIG. 4 is a diagram illustrating a scan operation of multiple beams in the first embodiment.

FIG. 4 is a diagram illustrating a scan operation of multiple beams in the first embodiment. In an example of FIG. 4, the case of multiple primary electron beams 20 of 5×5 rows is shown. An irradiation region 34 that can be irradiated with the beams with one irradiation of the multiple primary electron beams 20 is defined by (an x-direction size obtained by multiplying an inter-beam pitch in the x direction of the multiple primary electron beams 20 on the surface of the substrate 101 by the number of beams in the x direction)×(a y-direction size obtained by multiplying an inter-beam pitch in the y direction of the multiple primary electron beams 20 on the surface of the substrate 101 by the number of beams in the y direction). A width of each stripe region 32 is preferably set to a size similar to the y-direction size of the irradiation region 34 or a size narrowed by a scan margin. In the examples of FIGS. 3 and 4, the case where the irradiation region 34 has the same size as that of the mask die 33 is shown. However, the present disclosure is not limited thereto. The irradiation region 34 may be smaller than the mask die 33. Alternatively, the irradiation region 34 may be larger than the mask die 33. In addition, each beam of the multiple primary electron beams 20 scans (scan operation) the inside of sub-irradiation regions 29 surrounded by the inter-beam pitch in the x direction in which the beam is located and the inter-beam pitch in the y direction. Each beam configuring the multiple primary electron beams 20 is in charge of any one of the different sub-irradiation regions 29. At each shot, the same position in the assigned sub-irradiation region 29 is irradiated with each beam. The movement of the beam in the sub-irradiation region 29 is performed by collective deflection of the entire multiple primary electron beams 20 by the sub-deflector 209. The above operation is repeated and the inside of one sub-irradiation region 29 is sequentially irradiated with one beam. In addition, when scanning of one sub-irradiation region 29 is completed, the irradiation position moves to the adjacent sub-irradiation region 29 in the same stripe region 32 by collective deflection of the entire multiple primary electron beams 20 by the main deflector 208. The above operation is repeated and the inside of the stripe region 32 is sequentially irradiated with the beam. When scanning of one stripe region 32 is completed, the irradiation position moves to the next stripe region 32 by movement of the stage 105 and/or collective deflection of the entire multiple primary electron beams 20 by the main deflector 208.

For example, it is preferable that the plurality of chips 332 arranged in the x direction are configured as the same group and the chips 332 are divided into a plurality of stripe regions 32 having a predetermined width in the y direction, for example, for each group. In addition, the movement between the stripe regions 32 is not limited to each chip 332, and the movement is preferably performed in each group.

Here, when the substrate 101 is irradiated with the multiple primary electron beams 20 while the stage 105 moves continuously, a tracking operation by collective deflection is performed by the main deflector 208 so that the irradiation positions of the multiple primary electron beams 20 follows the movement of the stage 105. Therefore, the emission positions of the multiple secondary electron beams 300 change momentarily with respect to the orbit center axis of the multiple primary electron beams 20. Similarly, when the inside of the sub-irradiation region 29 is scanned, the emission position of each secondary electron beam changes momentarily in the sub-irradiation region 29. The deflector 218 collectively deflects the multiple secondary electron beams 300 so that the inside of the corresponding detection region of the multi-detector 222 is irradiated with each secondary electron beam of which emission position has changed as described above.

Figure 5:
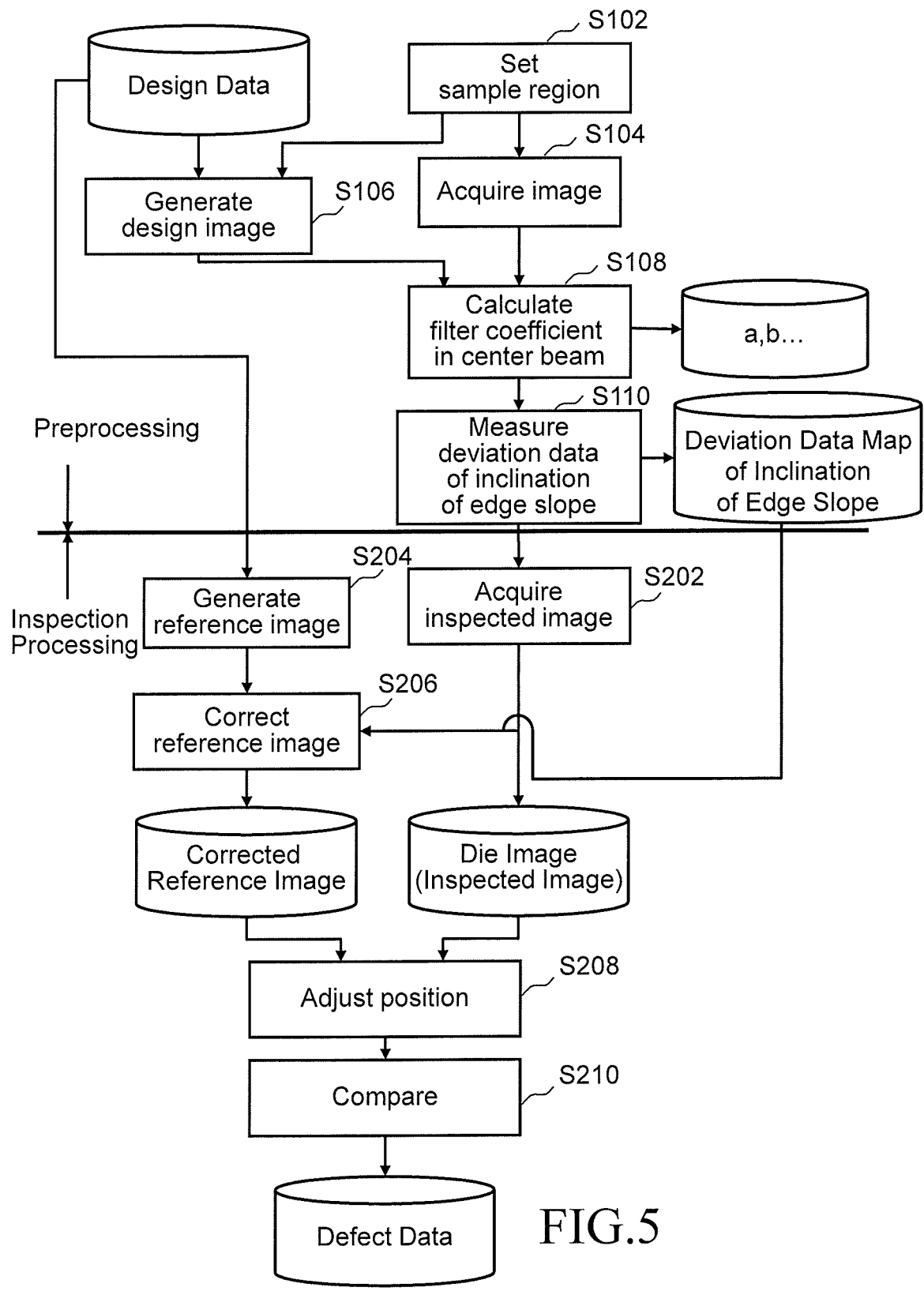
FIG. 5 is a flowchart showing main steps of an inspection method in the first embodiment.

FIG. 5 is a flowchart showing main steps of an inspection method in the first embodiment. In FIG. 5, the inspection method in the first embodiment executes a series of steps including a sample region setting step (S102), an image acquisition step (S104), a design image generation step (S106), a filter coefficient calculation step (S108), a deviation data measurement step (S110), an inspected image acquisition step (S202), a reference image generation step (S204), a reference image correction step (S206), a position adjustment step (S208), and a comparison step (S210).

In the sample region setting step (S102), the control computer 110 sets a sample region to calculate a filter function for generating a reference image from design data. The sample region is arbitrarily set from the inspection region 330 of the substrate 101 to be inspected. Alternatively, the sample region may be a region designated by a user. For example, the sample region may be set with reference to the layout of a figure pattern defined in the design data. As the sample region, the mask die 33 in which a figure pattern having a narrow line width is disposed and the mask die 33 in which a figure pattern having a wide line width is disposed are set. A plurality of sample regions may be regions in the same chip 332 or may be divided into the different chips 332.

In the image acquisition step (S104), the image acquisition mechanism 150 scans the stripe region 32 including the set sample region to acquire an image of the stripe region 32. In the acquisition of the image, as described above, the irradiation of the multiple primary electron beams 20 is performed, the multiple secondary electron beams 300 including the reflected electrons emitted from the substrate 101 due to the irradiation of the multiple primary electron beams 20 are detected by the multi-detector 222, and the secondary electron Image in the region is acquired. Reflected electrons and secondary electrons may be projected onto the multi-detector 222, and the reflected electrons may be diverged on the way and the remaining secondary electrons may be projected. The image acquisition mechanism 150 scans the stripe region 32 including the sample region formed with the figure pattern, by the multiple primary electron beams 20, and detects the multiple secondary electron beams 300 emitted from the inspected substrate 101 due to irradiation of the multiple primary electron beams 20. Detection data of the secondary electrons (measurement image:secondary electron image:inspected image) detected by the multi-detector 222 are output to the detection circuit 106 in order of measurement. In the detection circuit 106, analog detection data is converted into digital data by an A/D converter not shown in the drawings and is stored in the chip pattern memory 123. In this way, the image acquisition mechanism 150 acquires a measurement image of a pattern formed on the stripe region 32 including the sample region. In addition, the obtained measurement image data is transferred to the filter function calculation circuit 113 together with information indicating each position from the position circuit 107.

In the design image generation step (S106), the reference image generation circuit 112 performs image expansion of the set sample region to generate a design image (expansion image), on the basis of design pattern data defined in the design data on which a plurality of figure patterns (chip patterns) are formed or exposure image data of the chip patterns formed on the substrate 101. Specifically, the following operation is executed. First, the design pattern data is read from the storage device 109 through the control computer 110 and each figure pattern defined in the read design pattern data is converted (expanded) into binary or multi-valued image data.

Here, in the figure defined in the design pattern data is, for example, a rectangle or a triangle is used as a basic figure. For example, figure data in which a form, a size, a position, and the like of each pattern figure are defined by information such as the coordinates (x, y) at a reference position of the figure, a length of a side, and a figure code to be an identifier to distinguish a figure type such as the rectangle or the triangle is stored.

If the design pattern data to be the figure data is input to the reference image generation circuit 112, the data is expanded into data of each figure and a figure code showing the figure shape of the figure data, a figure dimension, and the like are interpreted. In addition, the data is expanded into binary or multi-valued design pattern image data as a pattern disposed in a square with a grid of a predetermined quantization dimension as a unit and is output. In other words, the design data is read, an occupancy rate occupied by the figure in the design pattern is calculated for each square formed by virtually dividing the inspection region as a square with a predetermined dimension as a unit, and n-bit occupancy rate data is output. For example, it is preferable to set one square as one pixel. Assuming that one pixel has a resolution of $\frac{1}{2}^8$ (=$\frac{1}{256}$), a small region of $\frac{1}{256}$ is allocated by the region of the figure disposed in the pixel to calculate the occupancy rate in the pixel. In addition, the data is output to the reference circuit 112 as 8-bit occupancy rate data. The square (inspection pixel) may be matched with the pixel of the measurement data. The data of the design image of the generated sample region is output to the filter function calculation circuit 113. Alternatively, it is preferable to generate a design image of the sample region in the filter function calculation circuit 113 instead of the reference image generation circuit 112.

In the filter coefficient calculation step (S108), the filter function calculation circuit 113 calculates coefficients a, b, . . . of a filter function F for generating a reference image corresponding to the measurement image (secondary electron image) of the sample region using the design image generated in the design image generation step (S106), in accordance with an image generation characteristic obtained by irradiation of a representative or predetermined beam of the multiple primary electron beams 20. As the representative beam, for example, the center beam of the multiple primary electron beams 20 is preferably used. However, the present disclosure is not limited thereto. A beam other than the center beam may be set as the representative beam. Since secondary electron image data as the measurement image is in a state in which the filter is operated by an electron optics, in other words, in an analog state in which a change is continuous, filter processing is performed on the design image data to be the image data of the design side where the image intensity (gray value) is a digital value, so that the data can be matched with the measurement data. The filter function for generating the reference image does not need to use a new function specially as long as it is matched with the image generation characteristic obtained by the irradiation of the center beam of the multiple primary electron beams 20, and a function similar to the conventional function may be used. Hereinafter, an example of the filter function F will be described.

Figure 6:
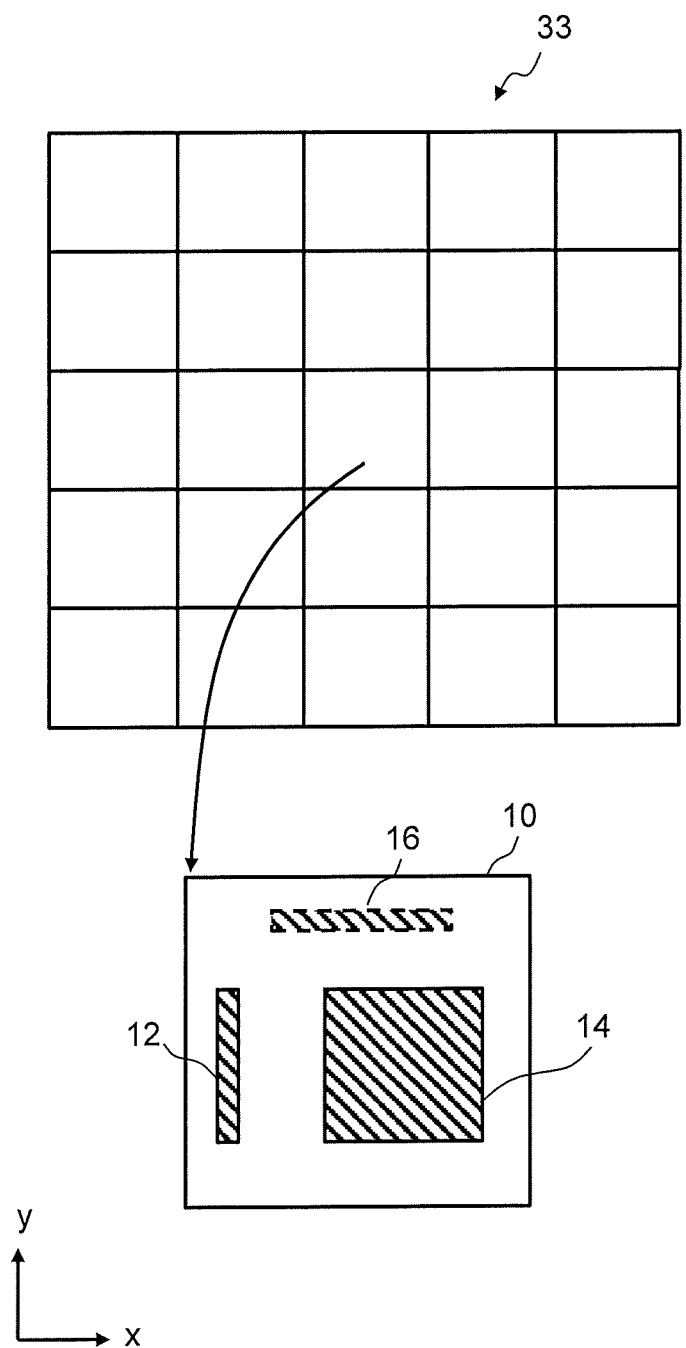
FIG. 6 is a diagram showing an example of a measurement image of a sample region in the first embodiment.

FIG. 6 is a diagram showing an example of a measurement image of the sample region in the first embodiment. The example of FIG. 6 shows an example of a secondary electron image of the mask die 33 set as the sample region obtained by the irradiation of the multiple primary electron beams 20 of 5×5 rows. In the first embodiment, the filter function for performing the filter processing is matched with the secondary electron image obtained by the irradiation of the representative beam (for example, the center beam) of the multiple primary electron beams 20. Further, the similar efficient is used with respect to the filter processing performed on the secondary electron image obtained by irradiation of other beams. As a result, calculation processing can be greatly simplified as compared with the case where the filter coefficient is calculated for each of the multiple beams. Therefore, the filter function calculation circuit 113 reads secondary electron image data of the image region 10 obtained by the irradiation of the center beam, among the secondary electron images of the mask dies 33 of the sample region. In the example of FIG. 6, in the image region 10 obtained by the irradiation of the center beam, a figure pattern 12 (line pattern) extending in the y direction and having a narrow line width in the x direction, a figure pattern 14 (rectangular pattern) having a wide line width in the x and y directions, and a figure pattern 16 (line pattern) extending in the x direction and having a narrow line width in the y direction are shown. Since there are edges in the x direction and edges in the y direction in edges of the figure patterns, it is necessary to perform calculation to match each edge shape. When the figure pattern 12 (line pattern) extending in the y direction and having a narrow line width in the x direction, the figure pattern 14 (rectangular pattern) having a wide line width in the x and y directions, and the figure pattern 16 (line pattern) extending in the x direction and having a narrow line width in the y direction are not disposed in one sample region, these data may be acquired from a plurality of sample regions.

FIGS. 7A to 7J are diagrams showing an example of an edge waveform of a design image, an edge waveform of a measurement image, and a model of a filter function in the first embodiment. As shown in the example of FIG. 7A, an edge waveform of a design image Lg of the figure pattern 12 having a narrow line width in the x direction is formed by a straight line that rises vertically in a digital manner, is bent at a right angle in a top portion and becomes horizontal by the line width, and falls vertically again. On the other hand, as shown in the example of FIG. 7B, a measurement image G1' of the figure pattern 12 having a narrow line width in the x direction is formed by a continuous curve line that rises obliquely, is bent with a large curvature in a top portion, and falls obliquely. Further, as shown in the example of FIG. 7C, similar to the figure pattern 12 having a narrow line width, an edge waveform of a design image Lg of the figure pattern 14 having a wide line width is also formed by a straight line that rises vertically in a digital manner, is bent at a right angle in a top portion and becomes horizontal by the line width, and falls vertically again. On the other hand, as shown in the example of FIG. 7D, a measurement image G2' of the figure pattern 14 having a wide line width is formed by a continuous curve line that rises obliquely, is bent with a small curvature in a top portion, and falls gently and obliquely. For example, in the figure pattern 12 having a narrow line width in the x direction, it is preferable to set as the filter function F a distribution function G1($x$) approximated so that a result, obtained by multiplying by a coefficient C1 a result of convolution of an edge image Legde shown in the example of FIG. 7F, having taken an absolute value of a differential image Ldif obtained by differentiating the design image Lg of the figure pattern 12 having a narrow line width in the x direction and shown in the example of FIG. 7E, and a distribution function G1($x$) scheduled to have a narrow width as shown in the example of FIG. 7G, is matched with the measurement image G1' of the figure pattern 12 having a narrow line width in the x direction. Further, for example, in the left edge of the figure pattern 14 having a wide line width in the x direction, instead of an edge image Legde shown in the example of FIG. 7I, having taken an absolute value of a differential image Ldif obtained by differentiating the design image Lg of the figure pattern 14 and shown in the example of FIG. 7H, the edge image Legde shown in the example of FIG. 7F, having taken an absolute value of the differential image Ldif obtained by differentiating the design image Lg of the figure pattern 12 and shown in the example of FIG. 7E, is used. In the left edge of the figure pattern 12 having a narrow line width in the x direction, it is preferable to set as the filter function F a combination coefficient of distribution functions G1($x$) and G2($x$) approximated so that maximum values of a term in which a result of convolution of the edge image Legde shown in the example of FIG. 7F, having taken an absolute value of the differential image Ldif obtained by differentiating the design image Lg of the figure pattern 12 and shown in the example of FIG. 7E, and the distribution function G1($x$) having a narrow width and shown in the example of FIG. 7G, is multiplied by the coefficient C1 and a term in which a result, obtained by multiplying by a coefficient C2 a result of convolution of the edge image Legde having taken an absolute value of the differential image Ldif obtained by differentiating the design image Lg of the figure pattern 12 and a distribution function G2($x$) scheduled to have a wide width and shown in the example of FIG. 7J, becomes valid in a range where the figure pattern 14 exists, that is, at the time of Lg>0 are matched with the measurement image G2' (measurement image G2L' of the left edge) of the figure pattern 14 having a wide line width in the x direction. The figure pattern 12 having a narrow line width in the x direction may be calculated by the same method using the distribution function G1($x$) and the distribution function G2($x$), similar to the figure pattern 14 having a wide line width. This is to cause the function to become substantially the same as the filter function of the figure pattern 12 having a narrow line width, even if a component of the distribution function G2($x$) is included, because the width of Lg is narrow and a signal component generated by the distribution function G2($x$) is limited, in the left edge of the figure pattern 12 having a narrow line width. Therefore, the coefficients of the combination function of the distribution functions G1($x$) and G2($x$) are acquired by calculation by the secondary electron image obtained by the irradiation of the center beam of the multiple primary electron beams 20, so that coefficients a, b, ... of the filter function F to generate the reference image can be acquired. The acquired coefficients a, b, ... of the filter function F are output to the reference image generation circuit 112 and stored.

In the edge slope inclination deviation data measurement step (S110), the edge slope inclination deviation data measurement circuit 130 measures a deviation of the inclinations of the edge slopes between the figure pattern of the secondary electron image obtained by the irradiation of the representative beam (for example, the center beam) and the figure pattern of the secondary electron image obtained by the irradiation of other beams, using the secondary electron images of the plurality of figure patterns of the substrate 101 to be inspected.

Figure 8A:
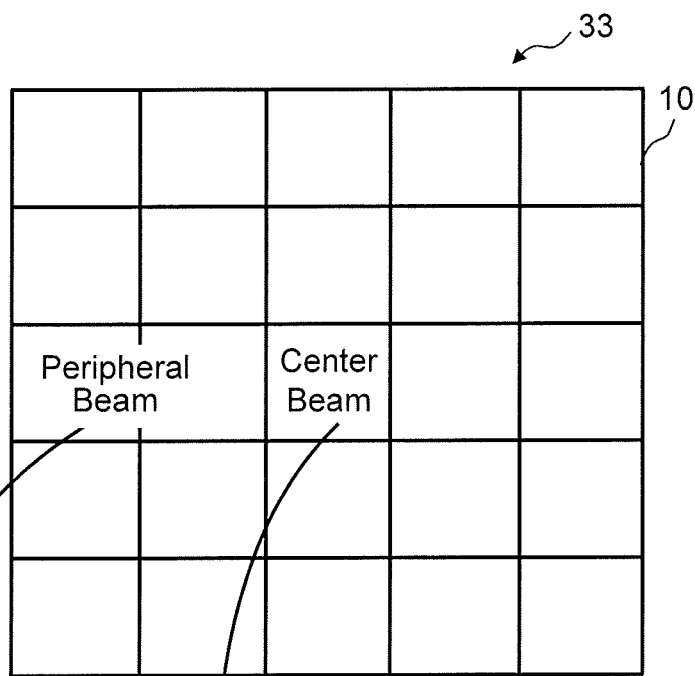
FIGS. 8A and 8B are diagrams illustrating a deviation of an inclination of an edge portion between a figure pattern of a secondary electron image obtained by irradiation of a center beam in the first embodiment and a figure pattern of a secondary electron image obtained by irradiation of other peripheral beams.
Figure 8B:
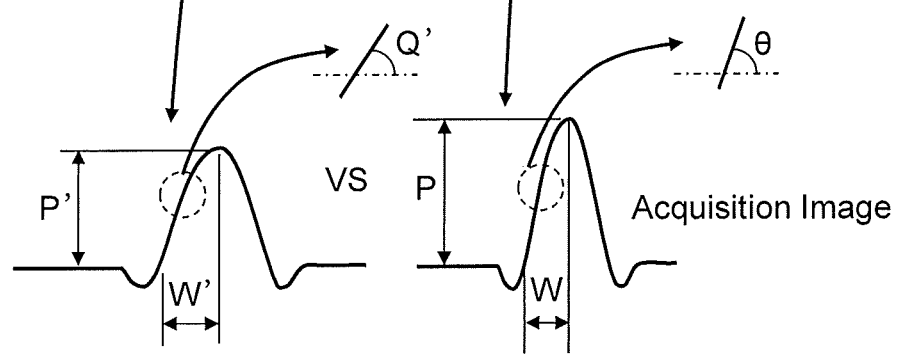

FIGS. 8A and 8B are diagrams illustrating a deviation of an inclination of an edge portion between a figure pattern of the secondary electron image obtained by the irradiation of the center beam in the first embodiment and a figure pattern of the secondary electron image obtained by the irradiation of other peripheral beams. As shown in FIG. 8A, in the measurement image of the mask die 33 to be the acquired sample region, the image region 10 imaged by irradiation of each beam of the multiple primary electron beams 20 exists. In the first embodiment, as shown in FIG. 8B, a peak intensity P and a trail amount W of the edge portion of the figure pattern in the image region 10 obtained by the irradiation of the center beam and a peak intensity P' and a trail amount W' of the edge portion of the figure pattern in the image region 10 obtained by the irradiation of other peripheral beams are compared. The peak intensity is defined by the intensity from a position before rising of the edge waveform to a peak position. The trail amount is defined, for example, by a width from a rising start position of the edge waveform to the peak position. Alternatively, the trail amount is preferably defined by a width from a position of a preset ratio of the peak position (for example, a position of 20% with respect to the peak position) to the peak position (100%).

As comparison targets, figure patterns having narrow widths are preferably used. However, the present disclosure is not limited thereto. Since the edge slopes are compared, the edge slopes of the figure patterns having the wide widths or the edge portion of the figure pattern having the wide width and the edge portion of the figure pattern having the narrow width may be compared. A deviation amount $\Delta P$ is calculated by subtracting the peak intensity P of the edge portion of the figure pattern in the image region 10 obtained by the irradiation of the center beam from the peak intensity P' of the edge portion of the figure pattern in the image region 10 obtained by the irradiation of each peripheral beam other than the center beam. Similarly, a deviation amount $\Delta W$ is calculated by subtracting the trail amount W of the edge portion of the figure pattern in the image region 10 obtained by the irradiation of the center beam from the trail amount W' of the edge portion of the figure pattern in the image region 10 obtained by the irradiation of each peripheral beam other than the center beam. The deviation amounts $\Delta P$ and $\Delta W$ are calculated for the edge in the x direction and the edge in the y direction. When a plurality of figure patterns exist in the image region 10, representative patterns are compared. Alternatively, it may be acquired as an average value of the comparison results using all the patterns.

The edge slope inclination deviation data measurement circuit 130 generates a deviation data map of the inclinations of the edge slopes in which the calculated deviation amounts $\Delta P$ and $\Delta W$ are defined. In the first embodiment, deviation information of the inclinations of the edge slopes between the figure pattern of the secondary electron image obtained by the irradiation of the representative beam and the figure pattern of the secondary electron image obtained by the irradiation of other beams is acquired (generated) as the deviation data map of the inclinations of the edge slopes, using the secondary electron images of the plurality of figure patterns of the substrate 101 to be inspected.

FIG. 9 is a diagram illustrating an example of an edge slope inclination deviation data map in the first embodiment. In FIG. 9, in the edge slope inclination deviation data map, the edge slope inclination deviation amounts $\Delta P$ and $\Delta W$ are preferably defined as edge slope inclination deviation data map values, for each beam of the multiple primary electron beams 20. In the center beam (coordinates 0, 0), both the edge slope inclination deviation amounts $\Delta P$ and $\Delta W$ become zero. In other peripheral beams (coordinates x, y), the edge slope inclination deviation amounts $\Delta P$ and $\Delta W$ become the calculated edge slope inclination deviation data map values. The generated edge slope inclination deviation data map is stored in the storage device 111.

When the above preprocessing ends, actual inspection processing is performed.

In the inspected image acquisition step (S202), the image acquisition mechanism 150 (secondary electron image acquisition mechanism) irradiates the substrate 101 formed with the plurality of figure patterns with the multiple primary electron beams 20, detects the multiple secondary electron beams 300 including the reflected electrons emitted from the substrate 101 due to (in accordance with) the irradiation of the multiple primary electron beams 20, and acquires the secondary electron images of the plurality of figure patterns. As described above, the reflected electrons and the secondary electrons may be projected onto the multi-detector 222, and the reflected electrons may be diverged on the way and the remaining secondary electrons may be projected. Specifically, the following operation is executed. As described above, the image acquisition mechanism 150 scans the stripe region 32 to acquire an image of the stripe region 32. In the acquisition of the image, as described above, the irradiation of the multiple primary electron beams 20 is performed, and the multiple secondary electron beams 300 including the reflected electrons emitted from the substrate 101 due to the irradiation of the multiple primary electron beams 20 are detected by the multi-detector 222. Detection data of the secondary electrons (measurement image:secondary electron image:inspected image) detected by the multi-detector 222 are output to the detection circuit 106 in order of measurement. In the detection circuit 106, analog detection data is converted into digital data by an A/D converter not shown in the drawings and is stored in the chip pattern memory 123. In this way, the image acquisition mechanism 150 acquires a measurement image of a pattern formed on each stripe region 32. In addition, the obtained measurement image data is transferred to the comparison circuit 108 together with information indicating each position from the position circuit 107.

In the reference image generation step (S204), the reference image generation circuit 112 (reference image generation unit) generates reference images corresponding to the secondary electron images, in accordance with the image generation characteristic of a secondary electron image obtained by the irradiation of the representative beam (for example, the center beam) of the multiple primary electron beams 20, based on the design data of the plurality of figure patterns formed on the substrate 101. The reference image generation circuit 112 generates a reference image for each frame region. For example, it is preferable to use the mask die 33 as the frame region. Specifically, the following operation is executed. First, the design pattern data is read from the storage device 109 through the control computer 110 and each figure pattern defined in the read design pattern data is converted into binary or multi-valued image data.

As described above, in the figure defined in the design pattern data is, for example, a rectangle or a triangle is used as a basic figure. For example, figure data in which a form, a size, a position, and the like of each pattern figure are defined by information such as the coordinates (x, y) at a reference position of the figure, a length of a side, and a figure code to be an identifier to distinguish a figure type such as the rectangle or the triangle is stored.

If the design pattern data to be the figure data is input to the reference image generation circuit 112, the data is expanded into data of each figure and a figure code showing the figure shape of the figure data, a figure dimension, and the like are interpreted. In addition, the data is expanded into binary or multi-valued design pattern image data as a pattern disposed in a square with a grid of a predetermined quantization dimension as a unit and is output. In other words, the design data is read, an occupancy rate occupied by the figure in the design pattern is calculated for each square formed by virtually dividing the inspection region as a square with a predetermined dimension as a unit, and n-bit occupancy rate data is output. For example, it is preferable to set one square as one pixel. Assuming that one pixel has a resolution of $\frac{1}{2}^8$ (=$\frac{1}{256}$), a small region of $\frac{1}{256}$ is allocated by the region of the figure disposed in the pixel to calculate the occupancy rate in the pixel. In addition, the data is output to the reference circuit 112 as 8-bit occupancy rate data. The square (inspection pixel) may be matched with the pixel of the measurement data.

Next, the reference image generation circuit 112 performs filter processing on the design image data of the design pattern to be image data of the figure, using the filter function F to which the calculated coefficient has been applied. As a result, the design image data to be the image data of the design side where the image intensity (gray value) is a digital value can be matched with the image generation characteristic obtained by the irradiation of the representative beam (for example, the center beam) of the multiple primary electron beams 20. The image data of the generated reference image is output to the image correction circuit 129.

In the reference image correction step (S206), the image correction circuit 129 (correction unit) generates corrected reference images in which an edge shape of a figure pattern of a reference image corresponding to the figure pattern of the secondary electron image obtained by the irradiation of each of the other peripheral beams in the reference images is corrected, on the basis of deviation information of the inclinations of the edge slopes between the figure pattern of the secondary electron image obtained by irradiation of the representative beam (for example, the center beam) of the multiple primary electron beams 20 and the figure pattern of the secondary electron image obtained by the irradiation of each of the other peripheral beams of the multiple primary electron beams 20.

Figure 10A:
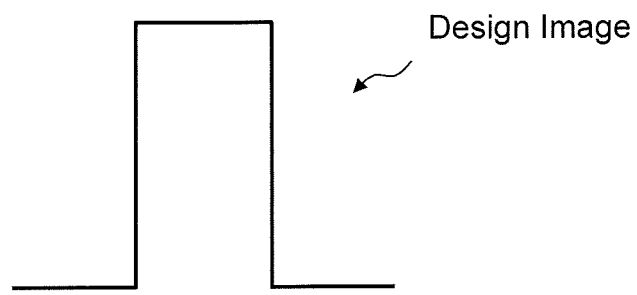
FIGS. 10A to 10C are diagrams showing an example of a reference image in the first embodiment.
Figure 10B:
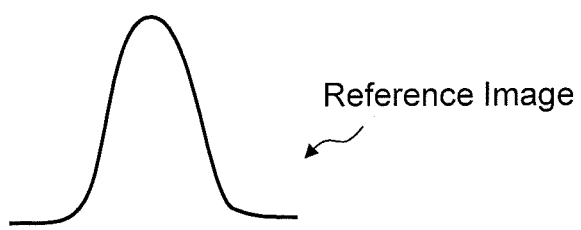
Figure 10C:
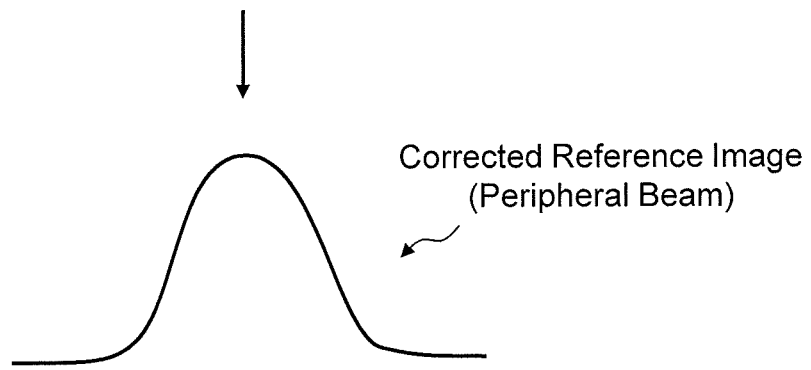

FIGS. 10A to 10C are diagrams showing an example of a reference image in the first embodiment. A design image having a rectangular waveform shown in FIG. 10A is converted into a reference image having a gentle curve waveform as shown in FIG. 10B by applying the filter processing using the filter function F. However, the reference image is generated in accordance with the image generation characteristic obtained by the irradiation of the representative beam (for example, the center beam) of the multiple primary electron beams 20. For this reason, a deviation may occur with the image obtained by the irradiation of beams other than the representative beam of the multiple primary electron beams 20. Therefore, the image correction circuit 129 reads the edge slope inclination deviation data map from the storage device 111, and corrects the reference image data in accordance with an image generation characteristic obtained by the irradiation of a primary electron beam of the primary electron beams applied to the image region 10, for each image region 10. Specifically, the image correction circuit 129 uses the peak intensity and the trail amount of the edge portion to correct the edge shape of a figure pattern of a reference image corresponding to the figure pattern of the secondary electron image obtained by the irradiation of each of beams other than the representative beam in the reference images. In the edge slope inclination deviation data map, the edge slope inclination deviation amounts $\Delta P$ and $\Delta W$ are defined as map values, for each beam of the multiple primary electron beams 20. Therefore, the image correction circuit 129 adds the edge slope inclination deviation amount $\Delta P$ defined in the used primary electron beam to the edge portion peak intensity P' of the figure pattern of the reference image, for each image region 10. Similarly, the image correction circuit 129 adds the edge slope inclination deviation amount $\Delta W$ defined in the used primary electron beam to the edge portion trail amount W' of the figure pattern of the reference image, for each image region 10. In addition, as shown in FIG. 10C, the image correction circuit 129 corrects the reference image data so as to become the waveform of the peak intensity and the trail amount to which the edge slope inclination deviation amounts $\Delta P$ and $\Delta W$ have been added, and generates the corrected reference image for each image region 10. The image data of the generated corrected reference images are output to the comparison circuit 108.

Here, in the example described above, the case where the edge portion deviation data is acquired from the sample region of the substrate 101 to be inspected has been described. However, the present disclosure is not limited thereto. Also, preferably, secondary electron images of a plurality of calibration patterns obtained by irradiating a calibration substrate formed with the plurality of calibration patterns with the multiple primary electron beams 20 and detecting the multiple secondary electron beams 300 including the reflected electrons emitted from the calibration substrate due to the irradiation of the multiple primary electron beams 20 are used to acquire deviation information of the inclinations of the edge slopes between the figure pattern of the secondary electron image obtained by the irradiation of the representative beam and the figure pattern of the secondary electron image obtained by the irradiation of other peripheral beams.

Figure 11:
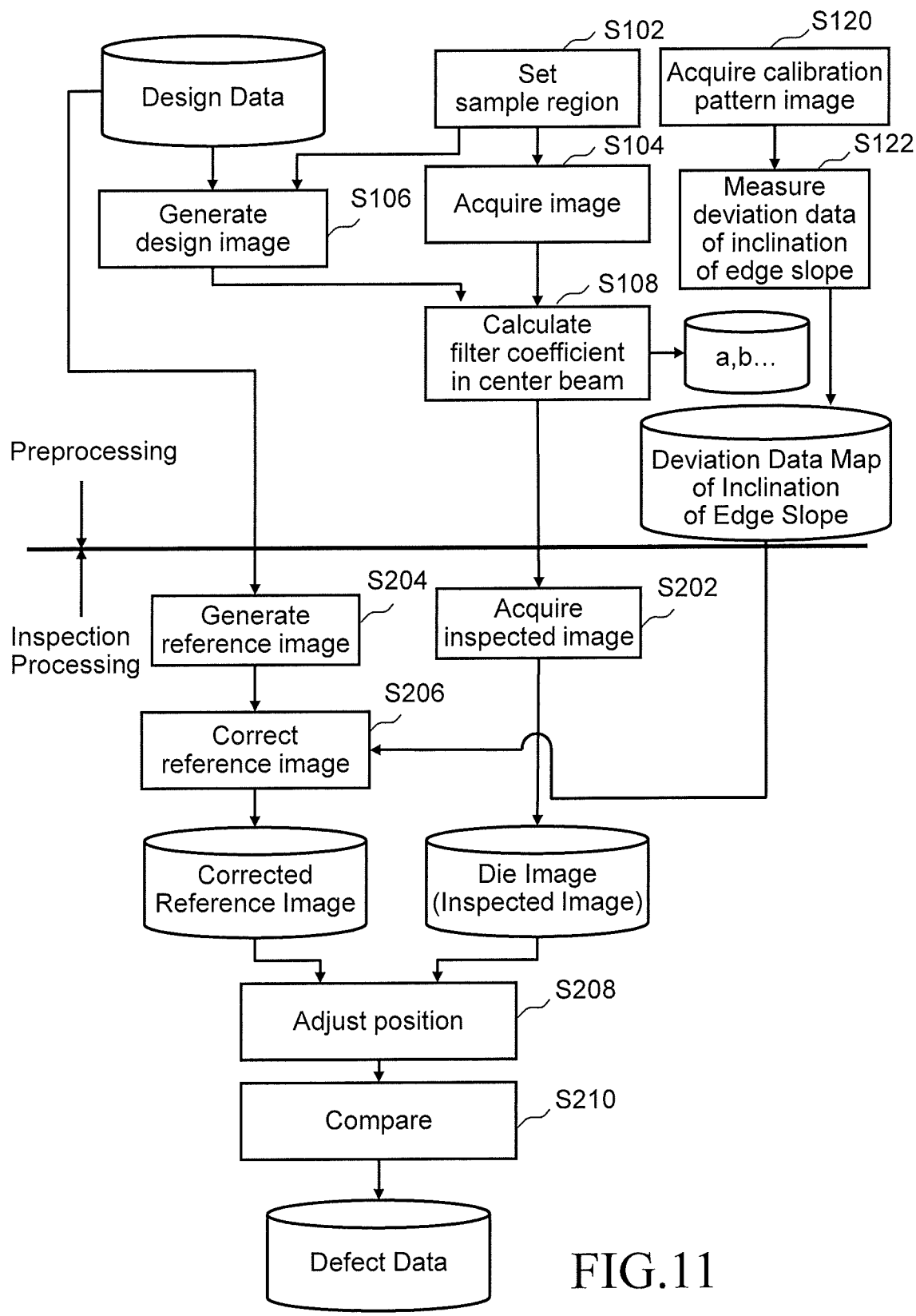
FIG. 11 is a flowchart showing main steps of an inspection method in a modification of the first embodiment.

FIG. 11 is a flowchart showing main steps of an inspection method in a modification of the first embodiment. FIG. 11 is the same as FIG. 5 except that a calibration pattern image acquisition step (S120) and an edge slope inclination deviation data measurement step (S122) are performed instead of the edge slope inclination deviation data measurement step (S110).

Before each step from the sample region setting step (S102) to the filter coefficient calculation step (S108), a calibration pattern image acquisition step (S120) and an edge slope inclination deviation data measurement step (S122) are performed. However, the present disclosure is not limited thereto. The steps may be performed after the steps from the sample region setting step (S102) to the filter coefficient calculation step (S108). Alternatively, the steps may be performed in parallel. However, it goes without saying that the image acquisition step (S104) and the calibration pattern image acquisition step (S120) are not performed simultaneously, when the steps are performed in parallel In the calibration pattern image acquisition step (S120), the image acquisition mechanism 150 disposes the calibration substrate formed with the plurality of calibration patterns on the stage 105. In addition, the image acquisition mechanism 150 scans the stripe region 32 on the calibration substrate to acquire an image of the stripe region 32. In the acquisition of the image, as described above, the irradiation of the multiple primary electron beams 20 is performed, the multiple secondary electron beams 300 including the reflected electrons emitted from the substrate 101 due to the irradiation of the multiple primary electron beams 20 are detected by the multi-detector 222, and the secondary electron Image in the region is acquired. As described above, the reflected electrons and the secondary electrons may be projected onto the multi-detector 222, and the reflected electrons may be diverged on the way and the remaining secondary electrons may be projected.

Figure 12:
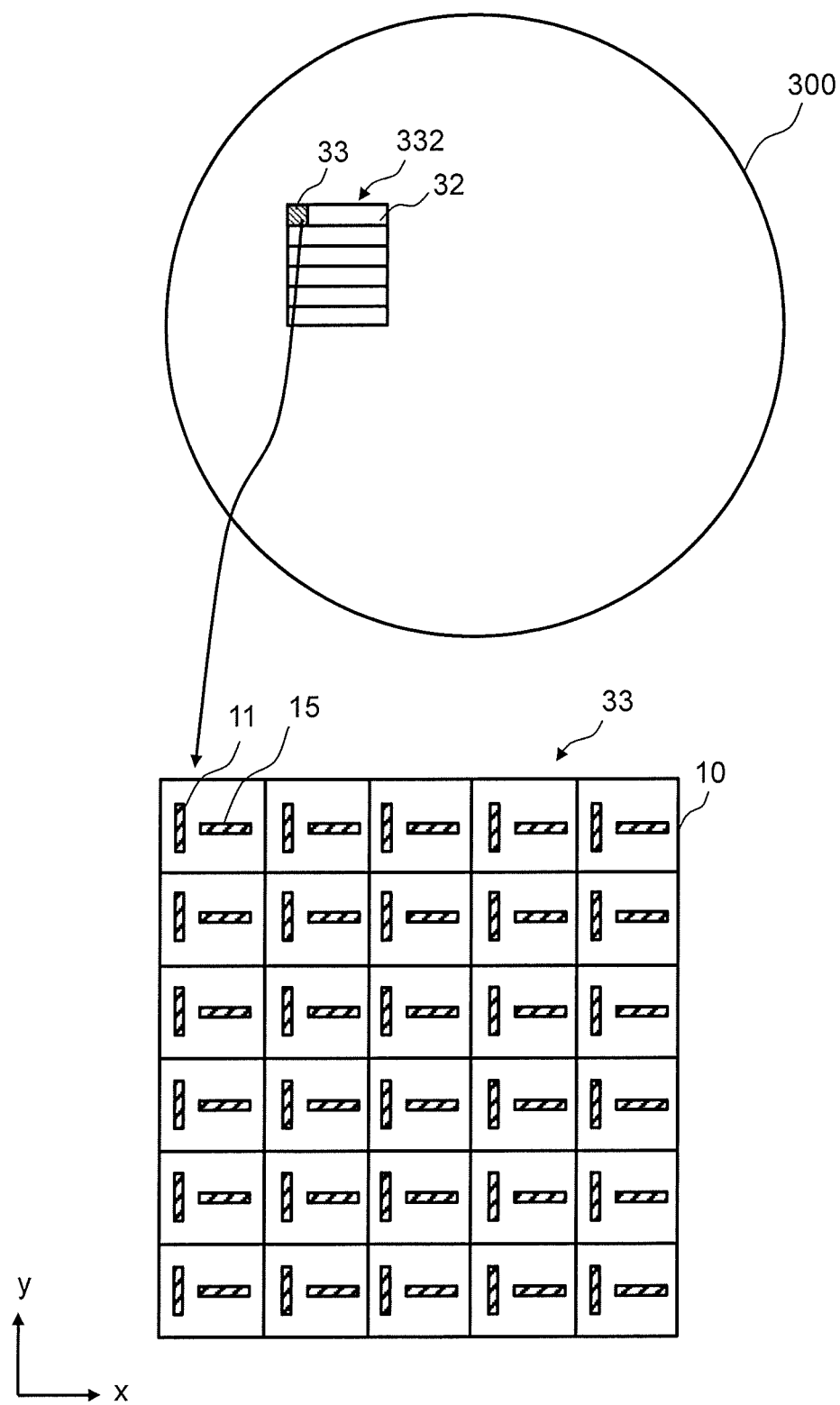
FIG. 12 is a diagram showing an example of a calibration substrate in the modification of the first embodiment.

FIG. 12 is a diagram showing an example of the calibration substrate in the modification of the first embodiment. In FIG. 12, when the substrate 101 is a semiconductor substrate (wafer), a calibration substrate 300 of the semiconductor substrate (wafer) is used. A chip (wafer die) 332 is disposed on the calibration substrate 300. A region of the chip 332 is divided into a plurality of stripe regions 32 with a predetermined width, for example, in the y direction. Each stripe region 32 is divided into a plurality of mask dies 33 in a longitudinal direction. The mask die 33 is divided into image regions 10 matched with the sub-irradiation regions 29 (although not shown in FIG. 12, these are the same as the sub-irradiation regions 29 shown in FIG. 4) irradiated with the respective beams of the multiple primary electron beams 20. In the example of FIG. 12, the case where irradiation of the multiple primary electron beams 20 of 5×5 rows is performed is shown. In each image region 10, a line pattern 11 having an edge in the x direction, for example, having a narrow line width, and a line pattern 15 having an edge in the y direction, for example, having a narrow line width, are formed as calibration patterns. A line pattern having a wide line width may be used as the calibration pattern. Alternatively, instead of the line pattern, rectangular patterns having edges in the x and y directions may be disposed. The image acquisition mechanism 150 scans the stripe region 32 formed with the calibration pattern, by the multiple primary electron beams 20, and detects the multiple secondary electron beams 300 emitted from the inspected substrate 101 due to irradiation of the multiple primary electron beams 20, by the multi-detector 222. Detection data of the secondary electrons (measurement image:secondary electron image: inspected image) detected by the multi-detector 222 are output to the detection circuit 106 in order of measurement. In the detection circuit 106, analog detection data is converted into digital data by an A/D converter not shown in the drawings and is stored in the chip pattern memory 123. In this way, the image acquisition mechanism 150 acquires measurement images of the plurality of calibration patterns formed on the stripe region 32. In addition, the obtained measurement image data of the calibration patterns is transferred to the filter function calculation circuit 113 together with information indicating each position from the position circuit 107.

In the edge slope inclination deviation data measurement step (S122), the edge slope inclination deviation data measurement circuit 130 measures a deviation of the inclinations of the edge slopes between the figure pattern of the secondary electron image obtained by the irradiation of the representative beam (for example, the center beam) and the figure pattern of the secondary electron image obtained by the irradiation of other beams, using the secondary electron images of the plurality of calibration patterns of the calibration substrate 300. As described above, here, a peak intensity P and a trail amount W of the edge portion of the calibration pattern in the image region 10 obtained by the irradiation of the representative beam (for example, the center beam) and a peak intensity P' and a trail amount W' of the edge portion of the calibration pattern in the image region 10 obtained by the irradiation of other beams (for example, peripheral beams) are compared. In addition, the edge slope inclination deviation data measurement circuit 130 calculates an edge slope inclination deviation amount ΔP by subtracting the peak intensity P of the edge portion of the calibration pattern in the image region 10 obtained by the irradiation of the representative beam (center beam) from the peak intensity P' of the edge portion of the calibration pattern in the image region 10 obtained by the irradiation of each beam other than the representative beam (center beam). Similarly, the edge slope inclination deviation data measurement circuit 130 calculates an edge slope inclination deviation amount ΔW by subtracting the trail amount W of the edge portion of the calibration pattern in the image region 10 obtained by the irradiation of the representative beam (center beam) from the trail amount W' of the edge portion of the calibration pattern in the image region 10 obtained by the irradiation of each beam other than the representative beam (center beam). The edge slope inclination deviation amounts ΔP and ΔW are calculated for the edge in the x direction and the edge in the y direction. In addition, the edge slope inclination deviation data measurement circuit 130 generates a deviation data map (deviation information) of the inclinations of the edge slopes in which the calculated edge slope inclination deviation amounts ΔP and ΔW are defined. The generated edge slope inclination deviation data map is stored in the storage device 111. The contents of each step up to the reference image correction step (S206) are the same as the contents described above.

As described above, it is preferable to acquire deviation data of the inclinations of the edge slopes between the beams from the calibration substrate 300.

Figure 13:
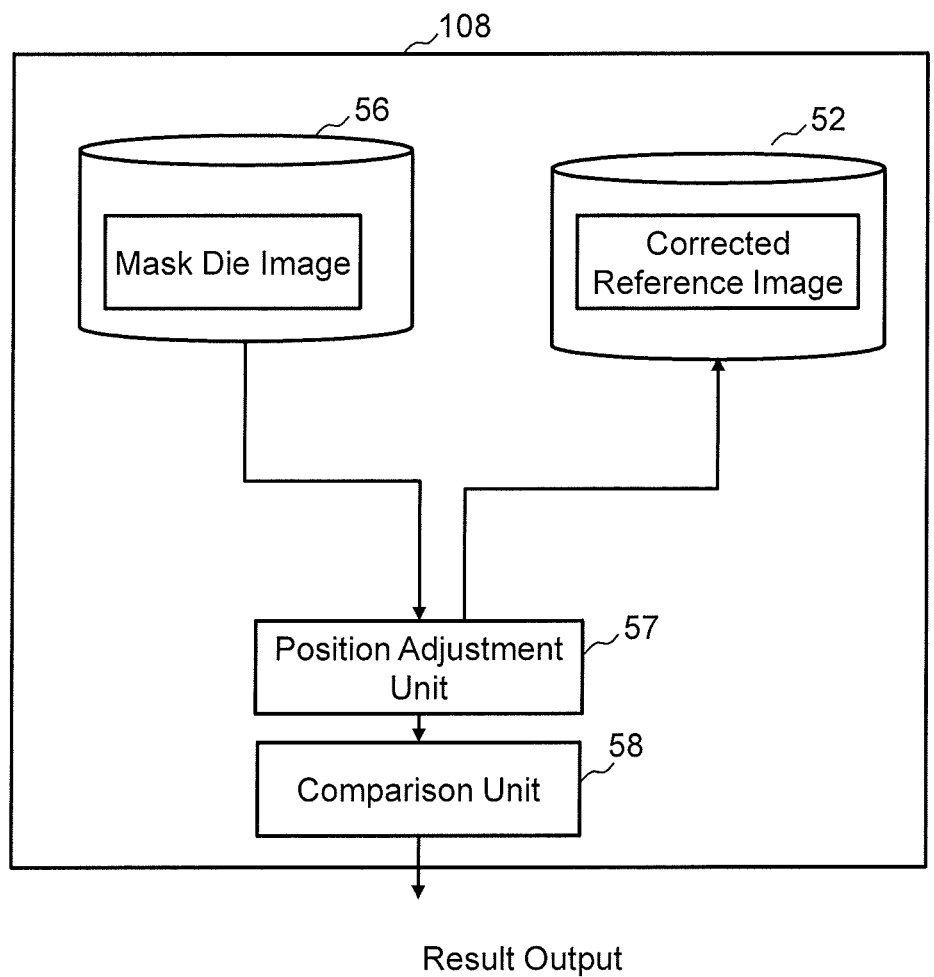
FIG. 13 is a configuration diagram showing an example of an internal configuration of a comparison circuit in the first embodiment.

FIG. 13 is a configuration diagram showing an example of an internal configuration of the comparison circuit in the first embodiment. In FIG. 13, storage devices 52 and 56 such as magnetic disk drives, a position adjustment unit 57, and a comparison unit 58 are disposed in the comparison circuit 108. Each "unit" such as the position adjustment unit 57 and the comparison unit 58 includes a processing circuit and an electric circuit, a computer, a processor, a circuit board, a quantum circuit, or a semiconductor device is included in the processing circuit. In addition, a common processing circuit (same processing circuit) may be used for each "unit". Alternatively, a different processing circuit (separate processing circuit) may be used. Necessary input data or calculated results in the position adjustment unit 57 and the comparison unit 58 are stored in a memory not shown in the drawings or the memory 118 each time.

In the comparison circuit 108, the transferred pattern image data (secondary electron image data) is temporarily stored in the storage device 56 as a mask die image for each mask die 33. Further, the transferred corrected reference image data is temporarily stored in the storage device 52.

In the position adjustment step (S208), the position adjustment unit 57 reads the mask die image to be the inspected image and the corrected reference image corresponding to the mask die image and adjusts positions of both the images in a unit of a sub-pixel smaller than the pixel. For example, the position adjustment may be performed by a method of least squares. The pixel size is preferably set to a region of a size similar to each beam size of the multiple primary electron beams 20, for example. Therefore, the sub-irradiation region 29 scanned by each beam is configured by n×n pixels. For example, the sub-irradiation region 29 is configured by 16×16 pixels.

In the comparison step (S210), the comparison unit 58 compares the mask die image (secondary electron image) with the corrected reference image. The comparison unit 58 compares both the images for each pixel according to a predetermined determination condition and determines presence or absence of a defect such as a shape defect, for example. For example, when a gray value difference for each pixel is larger than a determination threshold Th, the defect is determined. In addition, a comparison result is output. The comparison result may be output to the storage device 109, the monitor 117, or the memory 118 or may be output from the printer 119.

As described above, according to the first embodiment, even if there are differences in the characteristics of the electron beam images between the beams, a reference image matched with the characteristic of the electron beam image of each beam can be generated, and variations in the inspection sensitivity of the electron beam image can be suppressed.

Further, according to the first embodiment, it is possible to easily generate a reference image adapted to a characteristic difference between beams in multiple beam inspection as compared with the conventional method will be described.

In the above description, a series of "circuits" includes a processing circuit and an electric circuit, a computer, a processor, a circuit board, a quantum circuit, or a semiconductor device is included in the processing circuit. Further, a common processing circuit (same processing circuit) may be used for each "circuit". Alternatively, a different processing circuit (separate processing circuit) may be used. A program for executing a processor or the like may be recorded on a record carrier body such as a magnetic disk drive, a magnetic tape device, an FD, or a read only memory (ROM). For example, the position circuit 107, the comparison circuit 108, the reference image generation circuit 112, the filter function calculation circuit 113, the stage control circuit 114, the lens control circuit 124, the blanking control circuit 126, the deflection control circuit 128, the image correction circuit 129, and the deviation data measurement circuit 130 may be configured by at least one processing circuit described above.

The embodiments have been described with reference to the specific examples. However, the present disclosure is not limited to these specific examples. In the example of FIG. 1, the case where the multiple primary electron beams 20 are formed by the shaping aperture array substrate 203 from one beam irradiated from the electron gun assembly 201 to be one irradiation source is shown. However, the present disclosure is not limited thereto. The multiple primary electron beams 20 may be formed by performing irradiation of the primary electron beams from a plurality of irradiation sources.

Further, descriptions of parts and the like that are not directly necessary for explanation of the present disclosure, such as the apparatus configuration and the control method, are omitted. However, the necessary apparatus configuration and control method can be appropriately selected and used.

In addition, all multiple electron beam inspection apparatuses and multiple electron beam inspection methods including the elements of the present disclosure and capable of being appropriately designed and changed by those skilled in the art are included in the scope of the present disclosure.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple electron beam inspection apparatus comprising:
    a secondary electron image acquisition mechanism acquiring secondary electron images of figure patterns by irradiating a substrate formed with the figure patterns with multiple primary electron beams and detecting multiple secondary electron beams emitted from the substrate in accordance with the irradiation of the multiple primary electron beams;
    a reference image generation circuit generating reference images corresponding to the secondary electron images, in accordance with an image generation characteristic of a secondary electron image by irradiating one beam of the multiple primary electron beams, based on design data of the figure patterns;
    a correction circuit generating corrected reference images in which, on the basis of deviation information between a figure pattern of the secondary electron image by irradiating the one beam of the multiple primary electron beams and a figure pattern of a secondary electron image by irradiating another beam different from the one beam of the multiple primary electron beams, a shape of a figure pattern of a reference image corresponding to the figure pattern of the secondary electron image by the irradiation of the another beam in the reference images is corrected; and
    a comparison circuit comparing a secondary electron image of the secondary electron images and a corrected reference image of the corrected reference images.

2. The multiple electron beam inspection apparatus according to claim 1, wherein the correction circuit corrects an edge shape of the figure pattern of the reference image corresponding to the figure pattern of the secondary electron image by the irradiation of the another beam in the reference images, by comparing peak intensities and trail amounts of edge slopes between the figure pattern of the secondary electron image by irradiation of the one beam of the multiple primary electron beams and the figure pattern of the secondary electron image by irradiation of the another beam different from the one beam of the multiple primary electron beams.

3. The multiple electron beam inspection apparatus according to claim 1, wherein deviation information of inclinations of edge slope between the figure pattern of the secondary electron image by irradiation of the one beam and the figure pattern of the secondary electron image by irradiation of the another beam is obtained by comparing the secondary electron images of the calibration patterns by irradiating a calibration substrate formed with the calibration patterns with the multiple primary electron beams and detecting multiple secondary electron beams emitted from the calibration substrate in accordance with irradiation of the multiple primary electron beams.

4. The multiple electron beam inspection apparatus according to claim 1, wherein deviation information of inclinations of edge slope between the figure pattern of the secondary electron image by irradiation of the one beam and the figure pattern of the secondary electron image by irradiation of the another beam is acquired by the secondary electron images of the figure patterns of the substrate to be inspected.

5. The multiple electron beam inspection apparatus according to claim 1, wherein the correction circuit generates the corrected reference images in which an edge shape of a figure pattern of a reference image corresponding to the figure pattern of the secondary electron image by irradiation of the one beam in the reference images is not corrected and an edge shape of a figure pattern of a reference image corresponding to the figure pattern of the secondary electron image by irradiation of the another beam in the reference images is corrected.

6. The multiple electron beam inspection apparatus according to claim 5, wherein a center beam of the multiple primary electron beams is used as for the one beam.

7. The multiple electron beam inspection apparatus according to claim 1, further comprising:
a filter function calculation circuit calculating a coefficient of a filter function to generate the reference image according to the image generation characteristic of the secondary electron image by irradiation of the one beam, by a secondary electron image acquired in a sample region of an inspection region of the substrate and a design image of the sample region based on the design data.

8. The multiple electron beam inspection apparatus according to claim 7, wherein the filter function calculation circuit calculates the coefficient of the filter function by an image portion by irradiation of the one beam in the secondary electron image of the sample region.

9. The multiple electron beam inspection apparatus according to claim 7, wherein both a region where a figure pattern having a narrow line width is disposed and a region where a figure pattern having a wide line width is disposed are set as the sample region.

10. A multiple electron beam inspection method comprising:
acquiring secondary electron images of figure patterns by irradiating a substrate formed with the figure patterns with multiple primary electron beams and detecting multiple secondary electron beams emitted from the substrate in accordance with the irradiation of the multiple primary electron beams;
generating reference images corresponding to the secondary electron images, in accordance with an image generation characteristic of a secondary electron image by irradiating one beam of the multiple primary electron beams, based on design data of the figure patterns;
generating corrected reference images in which, on the basis of deviation information between a figure pattern of the secondary electron image by irradiating the one beam of the multiple primary electron beams and a figure pattern of a secondary electron image by irradiating another beam different from the one beam of the multiple primary electron beams, a shape of a figure pattern of a reference image corresponding to the figure pattern of the secondary electron image by the irradiation of the another beam in the reference images is corrected; and
comparing a secondary electron image of the secondary electron images and a corrected reference image of the corrected reference images and outputting a comparison result.

11. The multiple electron beam inspection method according to claim 10, wherein an edge shape of the figure pattern of the reference image corresponding to the figure pattern of the secondary electron image by the irradiation of the another beam in the reference images is corrected by peak intensities and trail amounts of edge slopes between the figure pattern of the secondary electron image by irradiation of the one beam of the multiple primary electron beams and the figure pattern of the secondary electron image by irradiation of the another beam different from the one beam of the multiple primary electron beams.

12. The multiple electron beam inspection method according to claim 10, wherein deviation information of inclinations of edge slope between the figure pattern of the secondary electron image by irradiation of the one beam and the figure pattern of the secondary electron image by irradiation of the another beam is acquired by the secondary electron images of the figure patterns of the substrate to be inspected.

13. The multiple electron beam inspection method according to claim 10, wherein the corrected reference images in which an edge shape of a figure pattern of a reference image corresponding to the figure pattern of the secondary by irradiation of the one beam in the reference images is not corrected and an edge shape of a figure pattern of a reference image corresponding to the figure pattern of the secondary electron image by irradiation of the another beam in the reference images is corrected are generated.

14. The multiple electron beam inspection method according to claim 10, further comprising:
calculating a coefficient of a filter function to generate the reference image according to the image generation characteristic of the secondary electron image by irradiation of the one beam, by a secondary electron image acquired in a sample region of an inspection region of the substrate and a design image of the sample region based on the design data.

15. The multiple electron beam inspection method according to claim 14, wherein the coefficient of the filter function is calculated by an image portion by irradiation of the one beam in the secondary electron image of the sample region.

* * * * *